(12) United States Patent
Duan et al.

(10) Patent No.: US 10,868,279 B2
(45) Date of Patent: Dec. 15, 2020

(54) ORGANIC ELECTROLUMINESCENT DEVICES AND MANUFACTURING METHODS THEREOF

(71) Applicants: KunShan Go-Visionox Opto-Electronics Co., Ltd., Kunshan (CN); TSINGHUA UNIVERSITY, Beijing (CN)

(72) Inventors: Lian Duan, Kunshan (CN); Pengcheng Wei, Kunshan (CN); Guomeng Li, Kunshan (CN)

( * ) Notice: Subject to any disclaimer, the term of this patent is extended or adjusted under 35 U.S.C. 154(b) by 0 days.

(21) Appl. No.: 16/510,989

(22) Filed: Jul. 15, 2019

(65) Prior Publication Data

US 2019/0341582 A1    Nov. 7, 2019

Related U.S. Application Data

(63) Continuation of application No. PCT/CN2018/096304, filed on Jul. 19, 2018.

(30) Foreign Application Priority Data

Dec. 22, 2017 (CN) .......................... 2017 1 1403767

(51) Int. Cl.
    *H01L 51/52* (2006.01)
    *H01L 51/00* (2006.01)
    *H01L 51/50* (2006.01)

(52) U.S. Cl.
    CPC ........ *H01L 51/5275* (2013.01); *H01L 51/001* (2013.01); *H01L 51/005* (2013.01); *H01L 51/006* (2013.01); *H01L 51/0059* (2013.01); *H01L 51/0072* (2013.01); *H01L 51/0058* (2013.01); *H01L 51/506* (2013.01); *H01L 51/5076* (2013.01); *H01L 2251/558* (2013.01)

(58) Field of Classification Search
    CPC ........................ H01L 51/0072; H01L 51/5076
    See application file for complete search history.

(56) References Cited

U.S. PATENT DOCUMENTS

| 2013/0285027 A1 | 10/2013 | Loebl et al. |
| 2016/0099437 A1 | 4/2016 | Beall et al. |
| 2018/0366650 A1 | 12/2018 | Yokoyama et al. |

(Continued)

FOREIGN PATENT DOCUMENTS

| CN | 1897777 A | 1/2007 |
| CN | 103180993 A | 6/2013 |

(Continued)

OTHER PUBLICATIONS

First Office Action of China Application No. 201711403767.9.

(Continued)

*Primary Examiner* — Mounir S Amer
(74) *Attorney, Agent, or Firm* — Kilpatrick Townsend & Stockton

(57) ABSTRACT

The present application discloses an organic electroluminescent device comprising carrier transport layers. The carrier transport layers include an electron transport layer and/or a hole transport layer, at least one of the carrier transport layers is doped with inert material having a refractive index less than 1.5. The present application also provides a manufacturing method of the above-mentioned organic electroluminescent device.

16 Claims, 3 Drawing Sheets

(56) References Cited

U.S. PATENT DOCUMENTS

2020/0176692 A1* 6/2020 Watabe .............. H01L 51/0072
2020/0176715 A1* 6/2020 Abe ................... H01L 51/5004

FOREIGN PATENT DOCUMENTS

| | | |
|---|---|---|
| CN | 103367644 A | 10/2013 |
| CN | 103579520 A | 2/2014 |
| CN | 104659268 A | 5/2015 |
| CN | 108539030 A | 9/2018 |
| WO | 2016102401 A1 | 6/2016 |
| WO | 2016204275 A1 | 12/2016 |

OTHER PUBLICATIONS

Taiwan First Office Action dated Jan. 30, 2019 in the corresponding TW application (application No. 107126948).
Taiwan Decision of Grant dated Jun. 20, 2019 in the corresponding TW application (application No. 107126948).
Amin Salehi et al., "Highly Efficient Organic Light-Emitting Diode Using a Low Refractive Index Electron Transport Layer", Advanced Optical Materials, May 2017, 7 pages.
Search Report and Written Opinion of International Application No. PCT/CN2018/096304.
Plastic Industry Dictionary, Dec. 31, 1989, p. 274-277.
Second Office Action of Chinese Application No. 201711403767.9.

* cited by examiner

ORGANIC ELECTROLUMINESCENT DEVICES AND MANUFACTURING METHODS THEREOF

CROSS-REFERENCES TO RELATED APPLICATIONS

This application is a continuation application of International application No. PCT/CN2018/096304, filed on Jul. 19, 2018, which claims priority to Chinese Patent application No. 201711403767.9, filed on Dec. 22, 2017, both of which are incorporated herein by reference in their entireties.

TECHNICAL FIELD

The present application belongs to the field of display technology.

BACKGROUND

In the existing panel display technology, Organic Light Emitting Diodes (OLEDs) have advantages of wide viewing angle, ultra-thin, fast response, high light-emitting efficiency and ability to realize flexible display, represent the trend of development of the next generation display and illumination, and have become one of the display technologies having the most promising application prospect.

SUMMARY

A technical problem to be solved by the present application is how to overcome the defect that, when trying to increase the optical output coupling efficiency, high-efficiency carrier transport capability of the transport layer cannot be guaranteed, and the light-emitting efficiency of the organic electroluminescent device is adversely affected.

Thus, an exemplary embodiment of the present application provides an organic electroluminescent device, comprising carrier transport layers, wherein the carrier transport layers comprise an electron transport layer and/or a hole transport layer, at least one of the carrier transport layers is doped with inert material having a refractive index less than 1.5.

Optionally, the inert material has the following molecular structure:

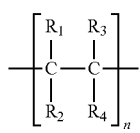

(I)

where $R_1$, $R_2$, $R_3$, $R_4$ are individually selected from fluorine, trifluoromethyl group, hydrogen or phenyl group, and at least one from $R_1$, $R_2$, $R_3$, $R_4$ is fluorine; and n is an integer.

Optionally, the n is an integer between 5 and 50.

Optionally, the inert material has a molecular structure selected from any one of the following structural formulas:

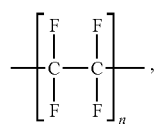

(I-1)

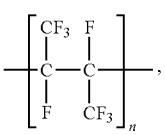

(I-2)

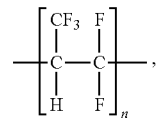

(I-3)

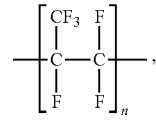

(I-4)

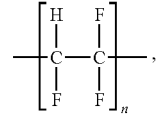

(I-5)

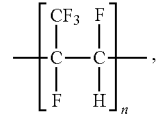

(I-6)

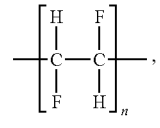

(I-7)

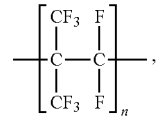

(I-8)

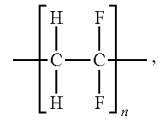

(I-9)

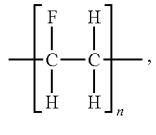

(I-10)

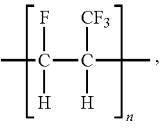

(I-11)

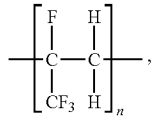

(I-12)

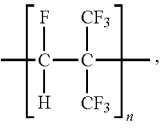

(I-13)

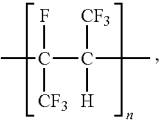

(I-14)

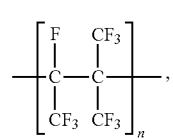 (I-15)

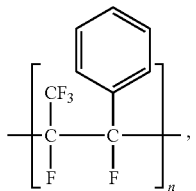 (I-16)

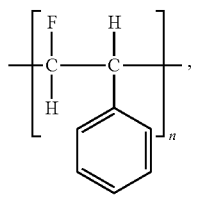 (I-17)

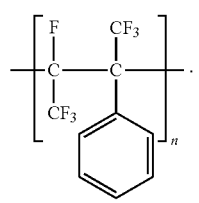 (I-18)

Optionally, the n is an integer between 10 and 30.

Optionally, the inert material has a doping proportion of 10 wt % to 90 wt %.

Optionally, the inert material has a doping proportion of 30 wt % to 60 wt %.

Optionally, the electron transport layer has an electron transport material which contains at least one selected from a quinoline derivative, a phenolic pyridine derivative, an o-phenanthroline derivative, a diphenyl benzoquinone derivative, a thiophene derivative, a furan derivatives, a carbodiimide derivative, a pyridine derivative, a diphenyl phosphoryl derivative, a dibenzothiophene derivative, an oxadiazole derivative, an anthraquinone di-methane derivative, an anthraquinone derivative, a triazine derivative, and a pyrazine derivative.

Optionally, the electron transport material has a molecular structure selected from any one of the following structural formulas:

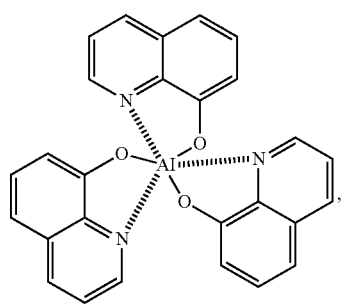 (II-1)

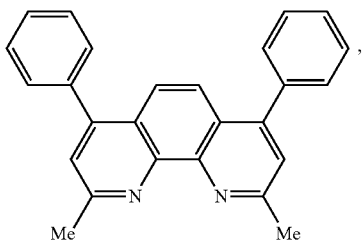 (II-2)

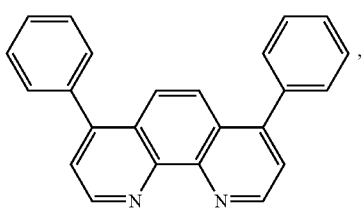 (II-3)

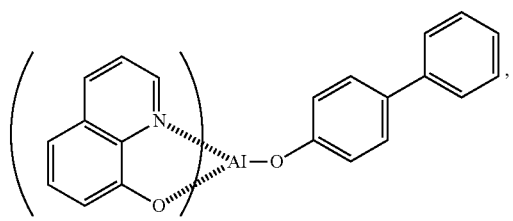 (II-4)

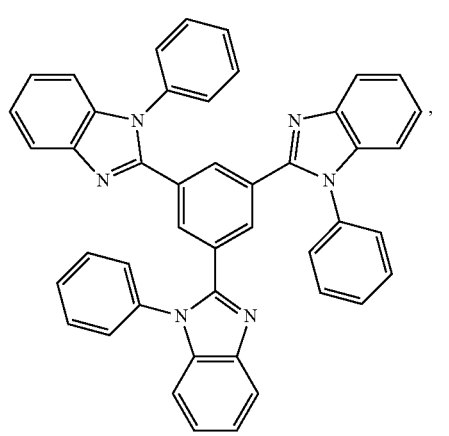 (II-5)

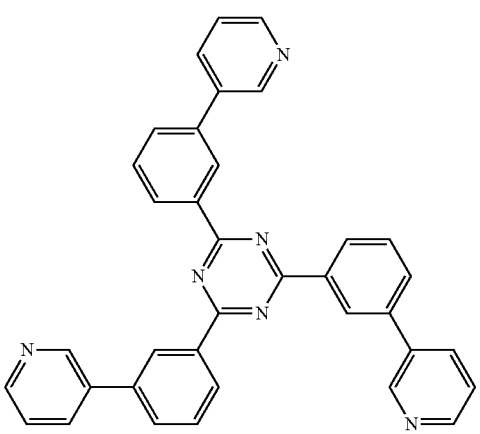 (II-6)

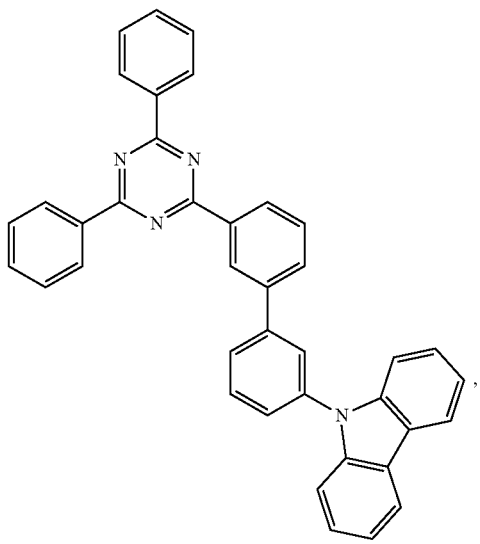

(II-7)

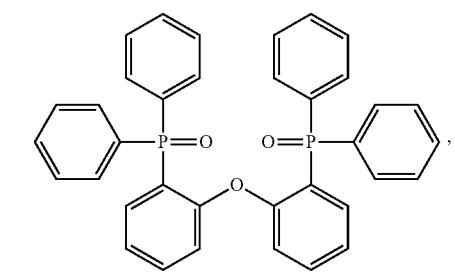

(II-8)

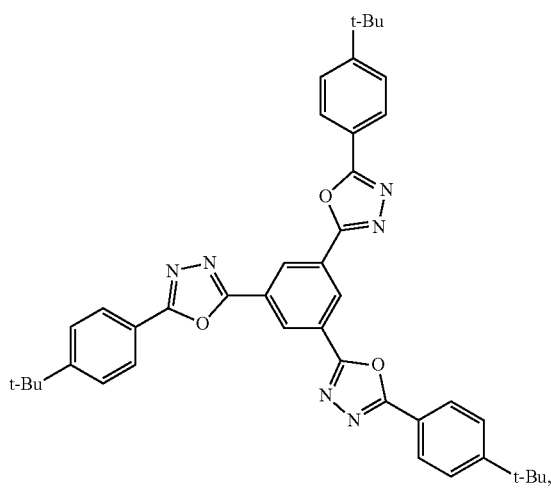

(II-9)

(II-10)

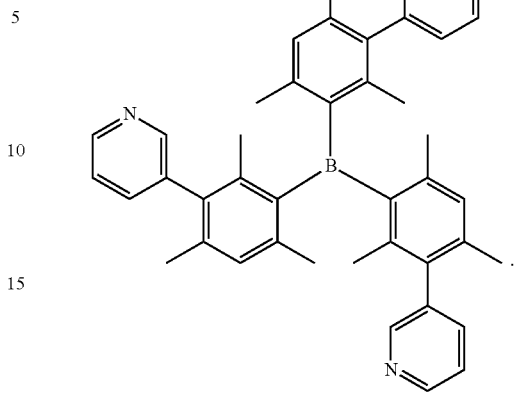

(II-11)

Optionally, the hole transport layer has a hole transport material which contains at least one selected from a triazole derivative, an oxadiazole derivative, an imidazole derivative, a carbazole derivative, an indole carbazole derivatives, a polyaromatic alkane derivative, a pyrazoline derivative, a pyrazolone derivative, a phenylenediamine derivative, an aromatic amine derivative, an amino-substituted chalcone derivative, an oxazole derivative, a styryl-anthracene derivative, a fluorenone derivative, a hydrazone derivative, a stilbene derivative, a silazane derivative, an aniline copolymer, a thiophene oligomer, a porphyrin compound, an aromatic tertiary amine compound, and a styryl amine compound.

Optionally, the hole transport material has a molecular structure selected from any one of the following structural formulas:

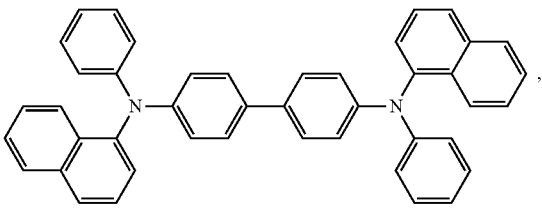

(III-1)

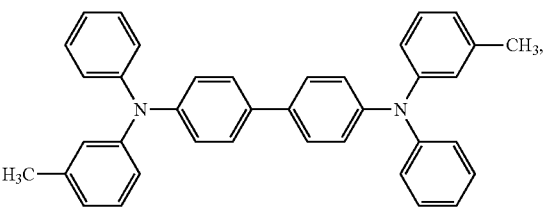

(III-2)

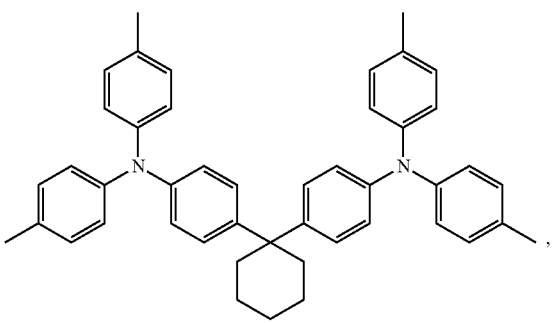

(III-3)

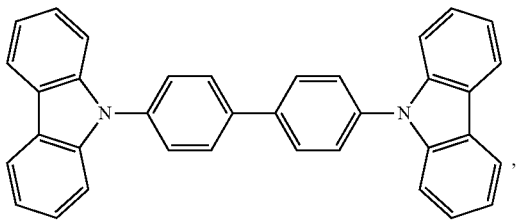
(III-4)

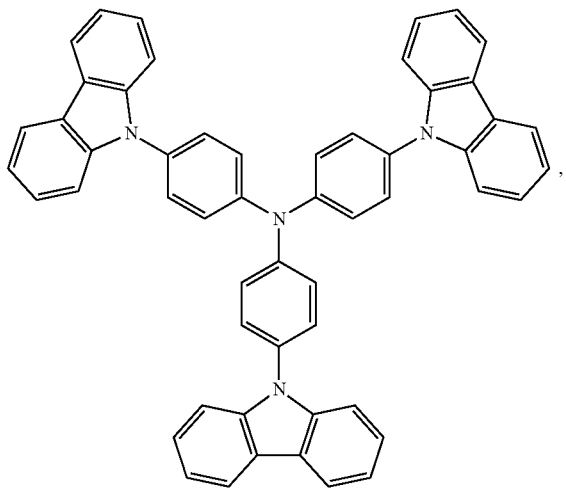
(III-5)

(III-6)

(III-7)

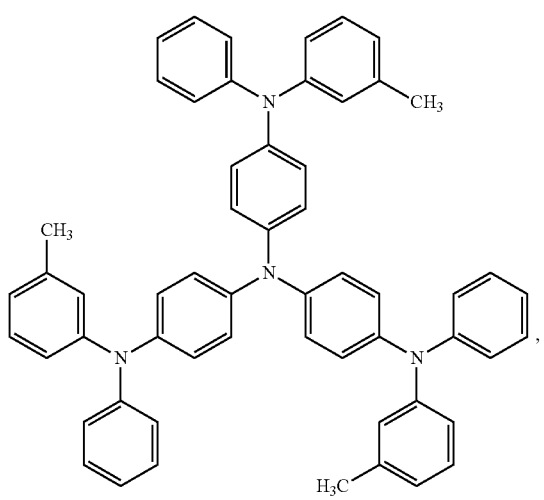

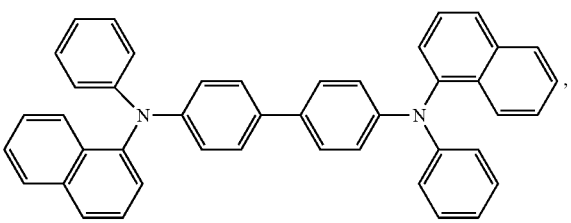
(III-8)

Optionally, the electron transport layer or the hole transport layer has a thickness of 5 nm to 500 nm.

Optionally, the electron transport layer or the hole transport layer has a thickness of 15 nm to 100 nm.

The inert material used in the present application is a material that has a low refractive index (its refractive index is less than 1.5), is easy to be evaporation-plated, and can be vacuum evaporation-plated together with the carrier transport material (electron transport material or hole transport material) at a temperature lower than 500° C. to form the transport layer. And in the meantime, the inert material has chemical inertness and does not react with the electron transport material or the hole transport material, so as to be able to guarantee the normal functioning of the electron transport material or the hole transport material in the organic electroluminescent device, the inert material also has an enhancement effect on the injection of charge carriers.

The present application also provides a manufacturing method of organic electroluminescent device, wherein, carrier transport layers of the organic electroluminescent device are manufactured by the step of performing vacuum-doped evaporation-plating by using a material having hole transport capability or electron transport capability together with an inert material, so as to form at least one layer of structure of the carrier transport layers; wherein the inert material has a refractive index less than 1.5.

Optionally, the vacuum-doped evaporation-plating is performed at an evaporation-plating temperature of 100-400° C.

Optionally, the material having hole transport capability has a molecular formula of (III-1)

and the inert material has a molecular formula of

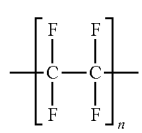
(I-1)

where n=26, the vacuum-doped evaporation-plating is performed with the material having hole transport capability and the inert material at a mass ratio of 7:3, so as to form the carrier transport layer, the evaporation-plating conditions are a vacuum degree of $5\times10^{-4}$ Pa and an evaporation-plating temperature of 240° C.

Optionally, the material having electron transport capability has a molecular formula of

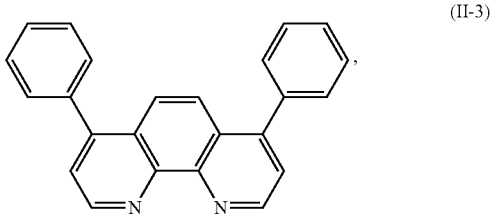 [SMILES: c1ccc(-c2ccnc3c2ccc2c(-c4ccccc4)ccnc23)cc1]

(II-3)

and the inert material has a molecular formula of

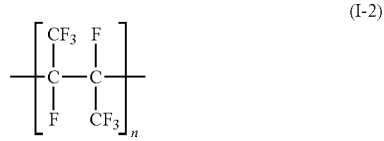

(I-2)

where n=10, the vacuum-doped evaporation-plating is performed with the material having electron transport capability and the inert material at a mass ratio of 8:2, so as to form the carrier transport layer, the evaporation-plating conditions are a vacuum degree of $5\times10^{-4}$ Pa and an evaporation-plating temperature of 190° C.

Optionally, the material having hole transport capability has a molecular formula of

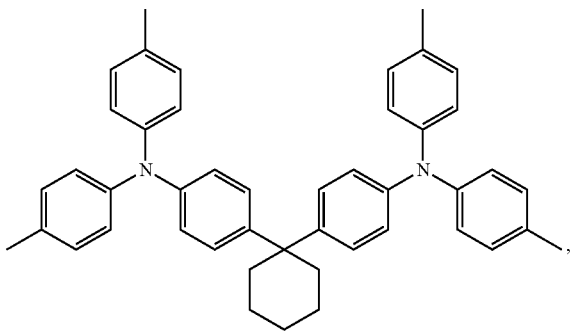

(III-3)

and the inert material has a molecular formula of

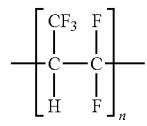

(I-3)

where n=30, the vacuum-doped evaporation-plating is performed with the material having hole transport capability and the inert material at a mass ratio of 4:6, so as to form the carrier transport layer, the evaporation-plating conditions are a vacuum degree of $5\times10^{-4}$ Pa and an evaporation-plating temperature of 210° C.

The technical solution provided by the present application has the following advantages:

1. The organic electroluminescent device provided by the present application comprises carrier transport layers, wherein the carrier transport layers comprise an electron transport layer and/or a hole transport layer. At least one of the carrier transport layers is doped with inert material having a refractive index less than 1.5. By doping with inert material having a low refractive index, the refractive index of the carrier transport layer can be effectively reduced, and when light emitted from the light-emitting layer is outputted from the carrier transport layer to the ITO layer, total reflection of the light at an interface between the carrier transport layer and the ITO layer, due to the incident angle being larger than the critical angle, can be lessened, the transmission direction of the light transmitting in the ITO/organics waveguide mode can be changed to a direction exiting to the exterior of the device, thereby effectively increasing the optical output coupling efficiency.

In the organic electroluminescent device, when the distance between the light-emitting layer and the cathode made of metal material is relatively near, light emitted from the light-emitting layer easily gets constrained in proximity to the metal electrode, and loss of light is caused by the surface plasma mode. The carrier transport layer provided by the present application is arranged between the light-emitting layer and the metal electrode, and as a result, in one aspect, the distance between the cathode and the light-emitting layer is increased, so that the loss of light caused by absorption by metal in the cathode as well as the loss of light caused by the surface plasma mode can be reduced; in another aspect, because the doping inert material lowers the refractive index of the carrier transport layer, when light transmits from the light-emitting layer to the carrier transport layer, total reflection between the light-emitting layer and the carrier transport layer is enhanced to make the light transmit in a direction away from the metal electrode, thereby effectively reducing the loss of light caused by the surface plasma mode.

At the same time, when the carrier transport layer is doped with the inert material with a low refractive index, not only the refractive index of the carrier transport layer can be effectively reduced, so as to increase the light extraction efficiency, but also the carrier injection capability of the transport layer is increased. Furthermore, at the same time as increasing the optical output coupling efficiency of the device, the transport layer keeps high carrier transport efficiency, which is in favor of carrier balance and enhancement of light-emitting efficiency of the organic electroluminescent device.

2. The inert material in the carrier transport layer of the organic electroluminescent device of the present application is a kind of inert organic molecular material with low cost of use and advantage of having both chemical inertness and insulation stability, so that, at the same time as reducing the refractive index of the carrier transport layer, stable use of the organic electroluminescent device can be guaranteed.

When the n in the molecular formula of this kind of inert material is an integer between 5 and 50, a suitable molecular chain length and molecular weight can be formed, which makes the material have the characteristic of being easily evaporation-plated, so that the material can be vacuum evaporation-plated together with the carrier transport material at a vacuum degree of $5\times10^{-4}$ Pa and at a temperature lower than 500° C. to manufacture the carrier transport layer, which is suitable for manufacturing an evaporation-plated type device. When the n is an integer between 10 and 30, its evaporation-plating performance is further improved, being in favor of vacuum evaporation-plating at a temperature of 100-400° C., and meanwhile, the thermal stability of the material is increased, the manufacturing difficulty of the device is further reduced, in favor of forming a uniform carrier transport layer, thereby improving the performance and efficiency of the electroluminescent device.

3. The inert material in the carrier transport layer of the organic electroluminescent device provided by the present application has a doping proportion (the ratio of the mass of the inert material to the total mass of the inert material plus the electron transport material or the hole transport material) of 10 wt % to 90 wt %, preferably 30 wt % to 60 wt %. The carrier transport layer with the inert material in the above-mentioned doping range can have optimal optical output coupling efficiency and carrier migration efficiency.

4. Regarding the carrier transport layer of the organic electroluminescent device provided by the present application, when the carrier transport material is a hole transport material, it can be doped with the inert material with a low refractive index to form a hole transport layer between the ITO layer and the light-emitting layer, so as to effectively reduce the loss of light caused by the ITO/organics waveguide mode. When the carrier transport material is an electron transport material, it can be doped with the inert material with a low refractive index to form an electron transport layer between the metal cathode and the light-emitting layer, so as to reduce the loss of light caused by the surface plasma mode, thereby improving the light-emitting efficiency of the device.

5. In the manufacturing method of organic electroluminescent device provided by the present application, vacuum-doped evaporation-plating is performed by using a material having hole transport capability or electron transport capability together with an inert material at an evaporation-plating temperature of 100-400° C., so as to form at least one layer of structure of the carrier transport layers. The inert material has a refractive index less than 1.5. A carrier transport layer with good uniformity and high efficiency can be manufactured with high efficiency, so that, at the same time as increasing the optical output coupling efficiency of the electroluminescent device, the carrier transport layer of the electroluminescent device can keep high carrier transport efficiency, so as to be in favor of carrier balance and light-emitting efficiency enhancement of the organic electroluminescent device.

6. In the organic electroluminescent device provided by the present application, because of having the above-mentioned carrier transport layer, the organic electroluminescent device has high light extraction efficiency as well as high carrier transport efficiency, so that high-efficiency light emitting of the organic electroluminescent material is realized.

7. In the organic electroluminescent device provided by the present application, the inert material is evenly dispersed in the carrier transport material to form a uniform carrier transport layer with a low refractive index, so that the loss of light caused by the ITO/organics waveguide mode or the surface plasma mode can be effectively prevented at different locations of the transport layer, thereby increasing the optical output coupling efficiency. And in the meantime, the carrier injection capability of the transport layer is evenly increased on the basis of the decrease of the overall refractive index of the carrier transport layer, thereby increasing the utilization efficiency of the organic electroluminescent device.

EXPLANATION OF THE REFERENCE SIGNS

Figure 1:
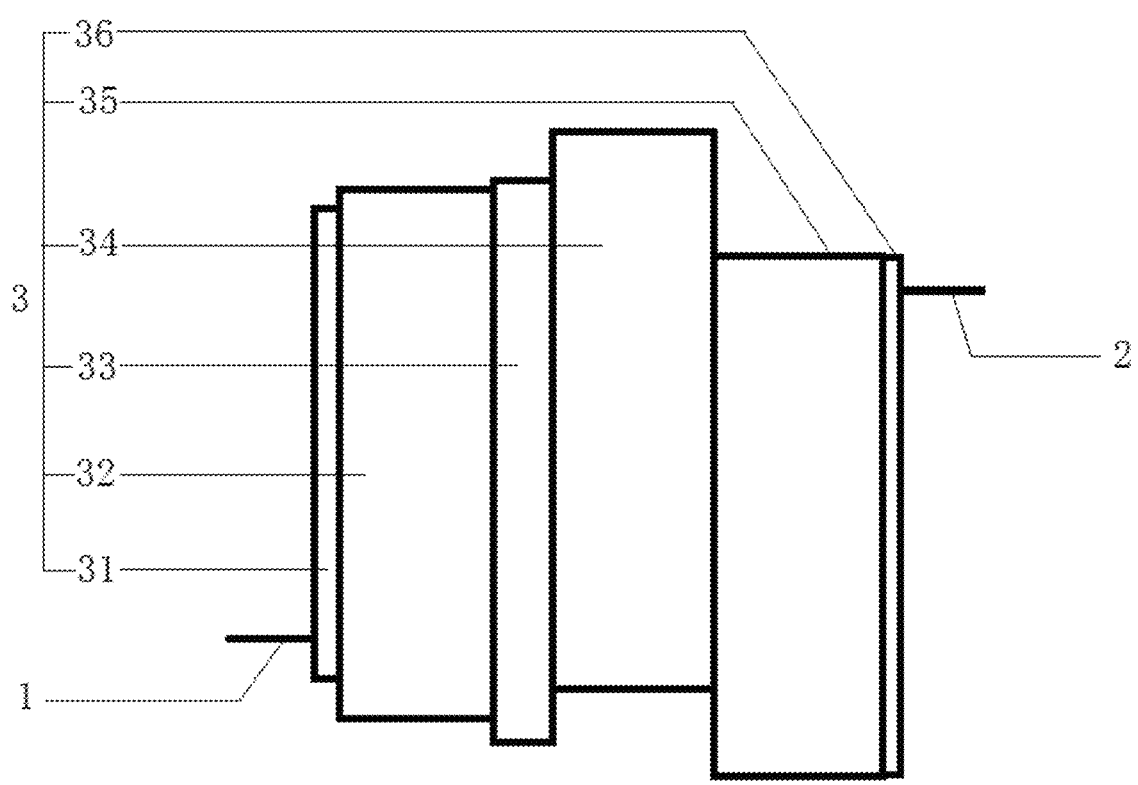
FIG. 1 is a structural view of the organic electroluminescent device in Exemplary embodiments 4-6 of the present application and Comparison Example 1.

1—anode;
2—cathode;
3—organic functional layer, 31—hole injection layer, 32—hole transport layer, 33—electron blocking layer, 34—light—emitting layer, 35—electron transport layer, 36—electron injection layer.

DETAILED DESCRIPTION OF THE INVENTION

Recently, OLED devices have made positive advancement in increasing the light-emitting efficiency of the devices, and the utilization of phosphorescent material has increased the internal quantum efficiency from 25% to almost 100% for an organic electro-phosphorescent device. The Thermal Activation Delayed Fluorescent (TADF) material can combine the advantages of fluorescent material and phosphorescent material at the same time, so as to realize an internal quantum efficiency of almost 100% in a fluorescent material. However, because of total reflection caused by inconsistent refractive indices of the respective layers of OLED, a large portion of the light emitted from the emitting layer of the OLED device is constrained within the device and cannot be effectively outputted to the exterior of the device. At present, the low optical output efficiency has become a major factor that limits the light-emitting efficiency of OLED.

According to optical analysis, photons generated from the light-emitting layer of OLED can be classified into four modes:

(1) external mode: the photons generated from the light-emitting layer finally exit to the exterior through the glass surface;

(2) substrate waveguide mode: the photons are constrained within the glass substrate by total reflection at the interface between the glass substrate and the air;

(3) ITO/organics waveguide mode: the photons are constrained within the ITO layer and the organic layer by total reflection at the interface between the ITO and the glass substrate;

(4) surface plasma mode: the photons are constricted in proximity to the metal electrode and partially absorbed by the metal material.

As known by calculation of ray optics in relation to the conventional structured OLED, only less than one fifth of the photons generated within the device can exit to the exterior of the device, the substrate waveguide mode and the ITO/organics waveguide mode respectively take up 34.2% and 46.9%, which means nearly 80% of the light is absorbed within the device or lost in the form of waveguide, not being able to effectively exit to the exterior of the device. Thus, it can be seen that, in order to increase the optical output efficiency of OLED, the proportion of the external mode needs to be increased, which means the substrate waveguide mode and the ITO/organics waveguide mode need to be converted to the external mode as much as possible, so that more photons generated in the device can exit to the exterior of the device.

Because the refractive index of the organic transport layer is generally about 1.8, when light transmits from the organic transport layer to the anode, the light rays having an incident angle larger than the critical angle are totally reflected, so the ITO/organics waveguide mode is produced, which causes the light rays to be unable to transmit to the exterior of the device. In consideration of this, the prior art provides a kind of organic transport material having a refractive index of 1.65, this kind of organic transport material with a reduced refractive index can partially turn the direction of the light transmitting in the waveguide mode towards the front surface, thereby increasing the light extraction efficiency to a certain extent. But this kind of directly-manufactured transport material with a low refractive index often cannot guarantee high-efficiency transport of electrons or holes in the transport material, which is disadvantageous for realizing high-efficiency use of the electroluminescent device.

Hereinafter, the technical solution of the present application is clearly and completely described with reference to the appended drawings. In the appended drawing, for the sake of clarity, dimensions and relative sizes of layers and areas might be exaggerated. It should be understood that, when one element such as a layer is described as "formed on" or "disposed on" another element, this one element may be disposed directly on that another element, or intermediate element(s) may also exist therebetween. On the contrary, when one element is described as "formed directly on" or "disposed directly on" another element, no intermediate element(s) exist therebetween.

Exemplary Embodiment 1

An exemplary embodiment of the present application provides an organic electroluminescent device, comprising a carrier transport layer. The carrier transport layer is a hole transport layer which comprises hole transport material doped with inert material therein. The inert material has a doping proportion of 30 wt %.

The inert material has a molecular structure of formula (I-1) where n=26, with a refractive index of 1.35.

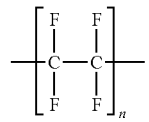

(I-1)

The hole transport material is N,N'-di-(1-naphthyl)-N,N'-diphenyl-1,1'-biphenyl-4,4'-diamine (abbreviated as NPB), with a molecular structure of formula (III-1):

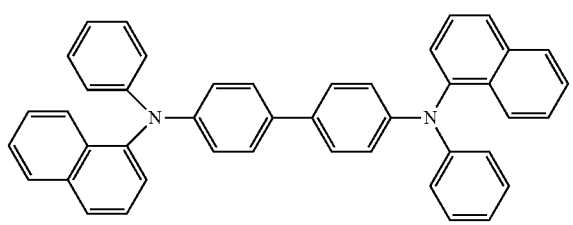

(III-1)

The manufacturing method of the carrier transport layer is performed by performing vacuum-doped evaporation-plating with the above-mentioned NPB and the inert material shown in formula (I-1) at a mass ratio of 7:3, so as to form the carrier transport layer. The evaporation-plating conditions are a vacuum degree of $5\times10^{-4}$ Pa and an evaporation-plating temperature of 240° C.

As alternative exemplary embodiments, in the carrier transport layer, the hole transport material may also choose material with the structure of any one of formulas (III-2) to (III-8), or any other material having hole transport capability.

Exemplary Embodiment 2

An exemplary embodiment of the present application provides an organic electroluminescent device, comprising a carrier transport layer. The carrier transport layer is an electron transport layer which comprises electron transport material doped with inert material therein, the inert material has a doping proportion of 20 wt %.

The inert material has a molecular structure of formula (I-2) where n=10, with a refractive index of 1.3.

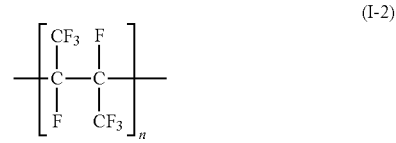

(I-2)

The electron transport material is 4,7-diphenyl-1,10-or-tho-phenanthroline (abbreviated as Bphen), with a molecular structure of formula (II-3):

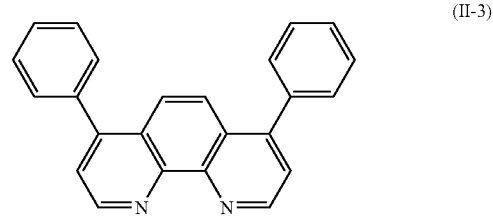 [SMILES: c1ccc(-c2ccnc3c2ccc2c(-c4ccccc4)ccnc23)cc1]

(II-3)

The manufacturing method of the carrier transport layer is performed by performing vacuum-doped evaporation-plating with the above-mentioned Bphen and the inert material shown in formula (I-2) at a mass ratio of 8:2, so as to form the carrier transport layer. The evaporation-plating conditions are a vacuum degree of $5\times10^{-4}$ Pa and an evaporation-plating temperature of 190° C.

As alternative exemplary embodiments, in the carrier transport layer, the electron transport material may also choose material with the structure of any one of formulas (II-2) to (II-11), or any other material having electron transport capability.

Exemplary Embodiment 3

An exemplary embodiment of the present application provides an organic electroluminescent device, comprising a carrier transport layer. The carrier transport layer is a hole transport layer which comprises hole transport material doped with inert material therein, the inert material has a doping proportion of 60 wt %.

The inert material has a molecular structure of formula (I-3) where n=30, with a refractive index of 1.36.

(I-3)

The hole transport material is 4,4'-cyclohexyl-di-[N,N'-di-(4-methylphenyl)]-phenylamine (abbreviated as TAPC), with a molecular structure of formula (III-3):

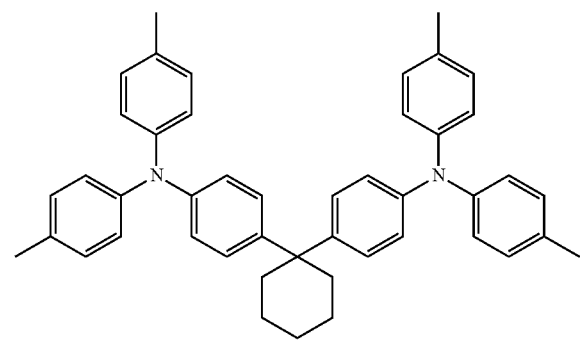
(III-3)

The manufacturing method of the carrier transport layer is performed by performing vacuum-doped evaporation-plating with the above-mentioned TAPC and the inert material shown in formula (I-3) at a mass ratio of 4:6, so as to form the carrier transport layer. The evaporation-plating conditions are a vacuum degree of $5\times10^{-4}$ Pa and an evaporation-plating temperature of 210° C.

Test Example 1

1. Refractive Index

The hole transport material of NPB, TAPC and the electron transport material of Bphen are taken as control groups, the Horiba Jobin Yvon Ellipsometer is used to measure the refractive index of the doped films (with a thickness of 100 nm), thereby testing the refractive indices of the carrier transport layers in Exemplary embodiments 1-3, and the results is shown in Table 1:

TABLE 1

| | Exemplary embodiment 1 | Exemplary embodiment 2 | Exemplary embodiment 3 | NPB | Bphen | TAPC |
|---|---|---|---|---|---|---|
| refractive index | 1.47 | 1.51 | 1.53 | 1.67 | 1.74 | 1.70 |

As known from the above test results of refractive indices of transport layers, the carrier transport layers in Exemplary embodiments 1-3 formed by doping the carrier transport material (hole transport material or electron transport material) with the inert material having a refractive index less than 1.5 have significantly reduced refractive indices of transport layers in comparison with undoped layers.

2. Single-Carrier Device

Figure 2:
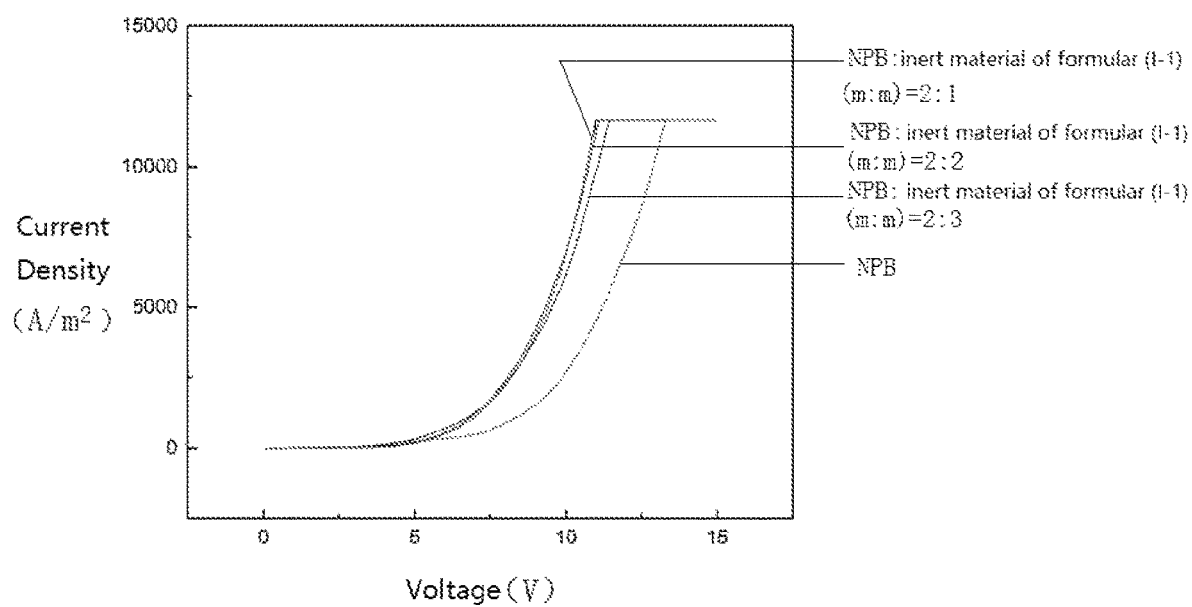
FIG. 2 is a voltage-current density diagram of the single-carrier devices in four structures of a, b c and d in Test Example 1 of the present application.

The hole transport material of NPB and the inert material shown in formula (I-1) adopted in Exemplary embodiment 1 are used to produce single-carrier devices in four structures of a, b c and d, and a voltage-current density diagram is drawn for the single-carrier devices, the measurement results are shown in FIG. 2. Wherein, the respective devices have the following structures:

| | |
|---|---|
| ITO\|inert material of formula (I-1):NPB (m:m)=2:1 (30 nm)\|Al | a. |
| ITO\|inert material of formula (I-1):NPB (m:m)=2:2 (30 nm)\|Al | b. |
| ITO\|inert material of formula (I-1):NPB (m:m)=2:3 (30 nm)\|Al | c. |
| ITO\|NPB (30 nm)\|Al | d. |

As known from FIG. 2, the current density of the single-carrier devices a, b, c is larger than the current density of the single-carrier device d at the same voltage, which indicates that, when NPB is doped with the inert material (I-1), the hole injection capability in the doped layer is increased, so as to enhance the hole transport capability in the doped layer in the single-carrier devices.

As known from the above test results of single-carrier devices, the carrier transport layer doped with the inert material has an increased carrier injection capability, which in turn enhances the transport capability of the carrier transport layer. Therefore, by mixing this kind of inert material with a low refractive index into the carrier transport material, the high-efficiency transport performance of the transport layer can be maintained at the same time as reducing the refractive index of the transport layer, which is in favor of carrier injection and carrier balance.

Exemplary Embodiment 4

The present exemplary embodiment provides an organic electroluminescent device, comprising carrier transport layers including a hole transport layer and an electron transport layer, wherein the hole transport layer is formed by hole transport material doped with inert material.

As shown in FIG. 1, the organic electroluminescent device has an anode 1, a cathode 2, and an organic functional layer 3 located between the anode 1 and the cathode 2. The organic functional layer 3 comprises a hole injection layer 31, a hole transport layer 32, an electron blocking layer 33, a light-emitting layer 34, an electron transport layer 35, and an electron injection layer 36.

In the organic electroluminescent device, the anode 1 is made of ITO material; the hole injection layer 31 is made of 2,3,6,7,10,11-hexacyanyl-1,4,5,8,9,12-hexaazabenzo-phenanthrene (abbreviated as HATCN). The hole transport layer 32 is made of hole transport material N,N'-di-(1-naphthyl)-N,N'-diphenyl-1,1'-biphenyl-4,4'-diamine (abbreviated as NPB) doped with the inert material (I-1) at a mass ratio of 7:3. The electron blocking layer 33 is made of hole-transport-type material 4,4',4"-tris-(carbazole-9-yl)-triphenylamine (abbreviated as TCTA). The light-emitting layer 34 is made of Bis-[4-(9,9-dimethyl-9,10-dihydroacri-dine)-phenyl]-sulfone (abbreviated as DMAC-DPS). The electron transport layer 35 is made of electron transport material 4,7-diphenyl-1,10-ortho-phenanthroline (abbreviated as Bphen). The electron injection layer 36 is made of electron injection material LiF, the cathode 2 is made of Al.

The electron injection layer 36 and the cathode 2 form an electron-injection-layer/metal-layer structure LiF/Al.

The above organic electroluminescent device, the inert material has a molecular structure of formula (I-1) where n=26, with a refractive index of 1.35. The Bphen has a molecular structure of formula (II-3) as follows. The NBP has a molecular structure of formula (III-1) as follows. The TCTA has a molecular structure of formula (III-5) as follows. The HATCN has a molecular structure of formula (III-8) as follows. The DMAC-DPS has a molecular structure of formula (IIII) as follows:

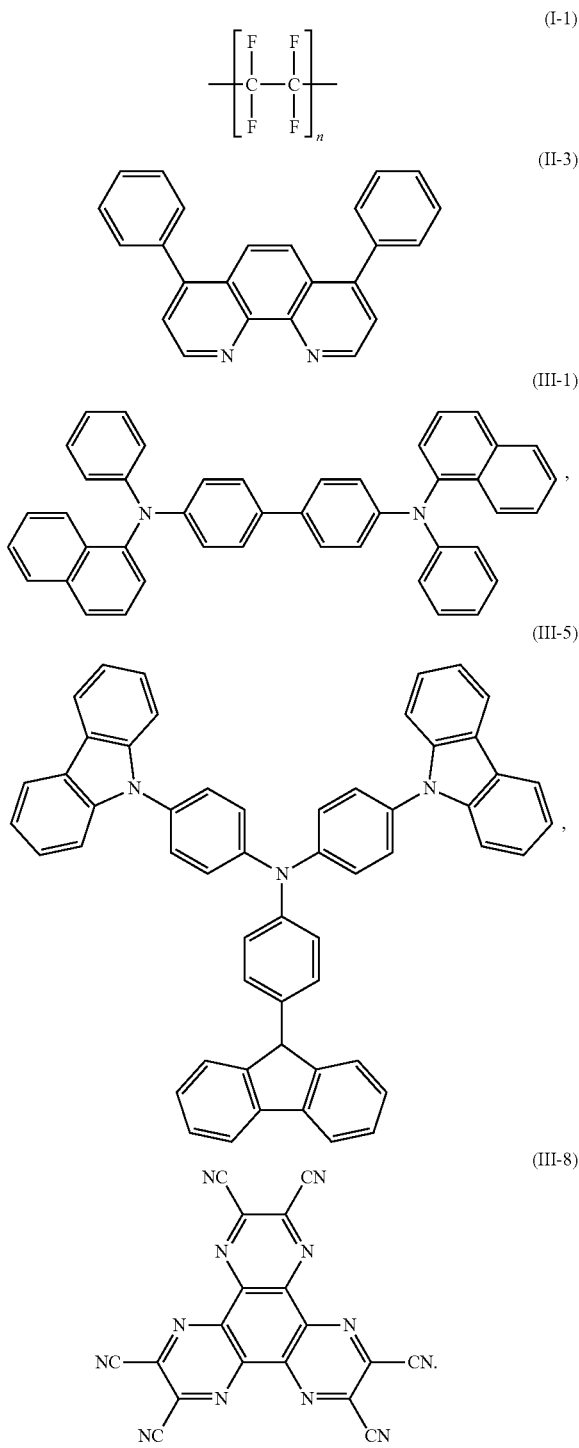

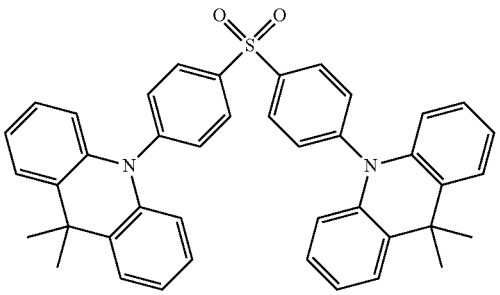

The organic electroluminescent device has the following specific structure: ITO|HATCN (5 nm)|NPB: 30% inert material of formula (I-1) (30 nm)|TCTA (10 nm)|DMAC-DPS (30 nm)|Bphen (30 nm)|LiF (0.5 nm)|Al (150 nm). In the organic electroluminescent device with the above structure, the hole transport layer is formed by mixing the hole transport material with the inert material having a low refractive index and is disposed between the ITO layer and the light-emitting layer. Because the hole transport layer formed by doping the hole transport material with the inert material having a low refractive index can effectively reduce the refractive index. When light emitted from the light-emitting layer is outputted from the hole transport layer to the ITO layer, total reflection of the light at an interface between the hole transport layer and the ITO layer, due to the incident angle being larger than the critical angle, can be lessened, the transmission direction of the light can be changed to a direction exiting to the exterior of the device. The loss of light caused by the ITO/organics waveguide mode is effectively reduced, thereby increasing the optical output coupling efficiency. In another aspect, at the same time as having a low refractive index, the hole transport layer also has a high hole transport capability, so that the organic electroluminescent device keeps excellent use performance at the same time as increasing the light output and having high external quantum efficiency.

As alternative exemplary embodiments, the thickness of the hole transport layer or the electron transport layer may also choose any thickness in a range of 5 nm-500 nm, preferably 15 nm-100 nm, which likewise can achieve the purpose of the present application and belongs to the protection scope of the present application.

Exemplary Embodiment 5

The present exemplary embodiment provides an organic electroluminescent device, comprising carrier transport layers including a hole transport layer and an electron transport layer. The electron transport layer is formed by electron transport material doped with inert material.

As shown in FIG. 1, the organic electroluminescent device has an anode 1, a cathode 2, and an organic functional layer 3 located between the anode 1 and the cathode 2. The organic functional layer 3 comprises a hole injection layer 31, a hole transport layer 32, an electron blocking layer 33, a light-emitting layer 34, an electron transport layer 35, and an electron injection layer 36.

In the organic electroluminescent device, the anode 1 is made of ITO material. The hole injection layer 31 is made of 2,3,6,7,10,11-hexacyanyl-1,4,5,8,9,12-hexaazabenzo-phenanthrene (abbreviated as HATCN). The hole transport layer 32 is made of hole transport material N,N'-di-(1- naphthyl)-N,N'-diphenyl-1,1'-biphenyl-4,4'-diamine (abbreviated as NPB). The electron blocking layer 33 is made of hole-transport-type material 4,4',4"-tris-(carbazole-9-yl)-triphenylamine (abbreviated as TCTA). The light-emitting layer 34 is made of Bis-[4-(9,9-dimethyl-9,10-dihydroacridine)-phenyl]-sulfone (abbreviated as DMAC-DPS). The electron transport layer 35 is made of electron transport material 4,7-diphenyl-1,10-ortho-phenanthroline (abbreviated as Bphen) doped with the inert material (I-2) at a mass ratio of 8:2. The electron injection layer 36 is made of electron injection material LiF, the cathode 2 is made of Al, wherein the electron injection layer 36 and the cathode 2 form an electron-injection-layer/metal-layer structure LiF/Al.

The above organic electroluminescent device, the inert material has a molecular structure of formula (I-2) where n=10, with a refractive index of 1.3. The Bphen has a molecular structure of formula (II-3) as above. The NBP has a molecular structure of formula (III-1) as above. The TCTA has a molecular structure of formula (III-5) as above. The HATCN has a molecular structure of formula (III-8) as above. The DMAC-DPS has a molecular structure of formula (IIII) as above.

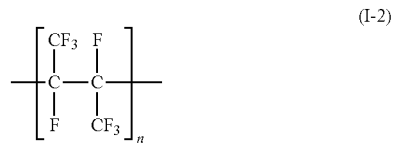

The organic electroluminescent device has the following specific structure: ITO|HATCN (5 nm)|NPB (30 nm)|TCTA (10 nm)|DMAC-DPS (30 nm) |Bphen: 20% inert material of formula (I-2) (30 nm)|LiF (0.5 nm)|Al (150 nm). In the organic electroluminescent device with the above structure, the electron transport layer is formed by mixing the electron transport material with the inert material having a low refractive index and is disposed between the cathode and the light-emitting layer. In one aspect, the distance between the cathode and the light-emitting layer is increased, so that the loss of light caused by absorption by metal in the cathode as well as the loss of light caused by the surface plasma mode of the cathode which constrains the light in proximity to the cathode can be reduced. In another aspect, because the electron transport layer has a low refractive index, when light transmits from the light-emitting layer to the carrier transport layer, total reflection between the light-emitting layer and the electron transport layer is enhanced to make the light transmit in a direction away from the metal electrode, thereby effectively reducing the loss of light caused by the surface plasma mode. In the meantime, after the electron transport material is doped with the inert material in the electron transport layer, the electron injection capability in the transport layer is increased, which in turn enhances the electron transport capability of the transport layer, so that the organic electroluminescent device keeps excellent use performance at the same time as increasing the light output and having high external quantum efficiency.

As alternative exemplary embodiments, the thickness of the hole transport layer or the electron transport layer may also choose any thickness in a range of 5 nm-500 nm, preferably 15 nm-100 nm, which likewise can achieve the purpose of the present application and belongs to the protection scope of the present application.

Exemplary Embodiment 6

The present exemplary embodiment provides an organic electroluminescent device, comprising carrier transport layers including a hole transport layer and an electron transport layer. The hole transport layer is formed by hole transport material doped with inert material, and the electron transport layer is formed by electron transport material doped with inert material.

As shown in FIG. 1, the organic electroluminescent device has an anode 1, a cathode 2, and an organic functional layer 3 located between the anode 1 and the cathode 2. The organic functional layer 3 comprises a hole injection layer 31, a hole transport layer 32, an electron blocking layer 33, a light-emitting layer 34, an electron transport layer 35, and an electron injection layer 36.

In the organic electroluminescent device, the anode 1 is made of ITO material. The hole injection layer 31 is made of 2,3,6,7,10,11-hexacyanyl-1,4,5,8,9,12-hexaazabenzophenanthrene (abbreviated as HATCN). The hole transport layer 32 is made of hole transport material N,N'-di-(1-naphthyl)-N,N'-diphenyl-1,1'-biphenyl-4,4'-diamine (abbreviated as NPB) doped with the inert material (I-1) at a mass ratio of 7:3. The electron blocking layer 33 is made of hole-transport-type material 4,4',4"-tris-(carbazole-9-yl)-triphenylamine (abbreviated as TCTA). The light-emitting layer 34 is made of Bis-[4-(9,9-dimethyl-9,10-dihydroacridine)-phenyl]-sulfone (abbreviated as DMAC-DPS). The electron transport layer 35 is made of electron transport material 4,7-diphenyl-1,10-ortho-phenanthroline (abbreviated as Bphen) doped with the inert material (I-2) at a mass ratio of 8:2. The electron injection layer 36 is made of electron injection material LiF, the cathode 2 is made of Al. The electron injection layer 36 and the cathode 2 form an electron-injection-layer/metal-layer structure LiF/Al.

The organic electroluminescent device has the following specific structure: ITO|HATCN (5 nm)|NPB: 30% inert material of formula (I-1) (30 nm)|TCTA (10 nm)|DMAC-DPS (30 nm)|Bphen: 20% inert material of formula (I-2) (30 nm) |LiF (0.5 nm)|Al (150 nm). In the organic electroluminescent device with the above structure, the hole transport layer is formed by mixing the hole transport material with the inert material having a low refractive index and is disposed between the ITO layer and the light-emitting layer. The electron transport layer is formed by mixing the electron transport material with the inert material having a low refractive index and is disposed between the cathode and the light-emitting layer. The loss of light caused by the ITO/organics waveguide mode and the surface plasma mode to the photons emitted from the light-emitting layer can be simultaneously reduced. The optical output efficiency of the device is significantly increased, and meanwhile, the transport layer in the device keeps high electron transport capability and hole transport capability, so that the device has high light-emitting efficiency and excellent use performance.

As alternative exemplary embodiments, the thickness of the hole transport layer or the electron transport layer may also choose any thickness in a range of 5 nm-500 nm, preferably 15 nm-100 nm, which likewise can achieve the purpose of the present application and belongs to the protection scope of the present application.

Comparison Example 1

The present Comparison Example provides an organic electroluminescent device with a structure as shown in FIG.

1. It has an anode 1, a cathode 2, and an organic functional layer 3 located between the anode 1 and the cathode 2. The organic functional layer 3 comprises a hole injection layer 31, a hole transport layer 32, an electron blocking layer 33, a light-emitting layer 34, an electron transport layer 35, and an electron injection layer 36.

In the organic electroluminescent device, the anode 1 is made of ITO material. The hole injection layer 31 is made of 2,3,6,7,10,11-hexacyanyl-1,4,5,8,9,12-hexaazabenzophenanthrene (abbreviated as HATCN). The hole transport layer 32 is made of hole transport material N,N'-di-(1-naphthyl)-N,N'-diphenyl-1,1'-biphenyl-4,4'-diamine (abbreviated as NPB). The electron blocking layer 33 is made of hole-transport-type material 4,4',4"-tris-(carbazole-9-yl)-triphenylamine (abbreviated as TCTA). The light-emitting layer 34 is made of Bis-[4-(9,9-dimethyl-9,10-dihydroacridine)-phenyl]-sulfone (abbreviated as DMAC-DPS). The electron transport layer 35 is made of electron transport material 4,7-diphenyl-1,10-ortho-phenanthroline (abbreviated as Bphen). The electron injection layer 36 is made of electron injection material LiF, the cathode 2 is made of Al, wherein the electron injection layer 36 and the cathode 2 form an electron-injection-layer/metal-layer structure LiF/Al.

The organic electroluminescent device has the following specific structure: ITO|HATCN (5 nm)|NPB (30 nm)|TCTA (10 nm)|DMAC-DPS (30 nm)|Bphen (30 nm) |LiF (0.5 nm)|Al (150 nm).

Test Example 2

Characteristics including current, voltage, illuminance, light-emitting spectrum of the device are tested in synchronization by using the PR 650. Spectral Scanning Luminometer and the Keithley K-2400 Digital Source Meter System. Tests are performed on the organic electroluminescent devices provided in Exemplary embodiments 4-6 and Comparison Example 1. The external quantum efficiencies of the organic electroluminescent devices in Exemplary embodiments 4-6 and Comparison Example 1 at the same luminance are compared, and the results are shown in Table 2 and FIG. 3.

TABLE 2

|  | Turn-on voltage (V) | Color coordinates CIE (x, y) | Maximal external quantum efficiency (%) |
|---|---|---|---|
| Exemplary embodiment 4 | 3.4 | (0.14, 0.08) | 13.4% |
| Exemplary embodiment 5 | 3.6 | (0.14, 0.08) | 12.8% |
| Exemplary embodiment 6 | 3.5 | (0.14, 0.08) | 15.3% |
| Comparison Example 1 | 3.6 | (0.14, 0.08) | 10.4% |

Figure 3:
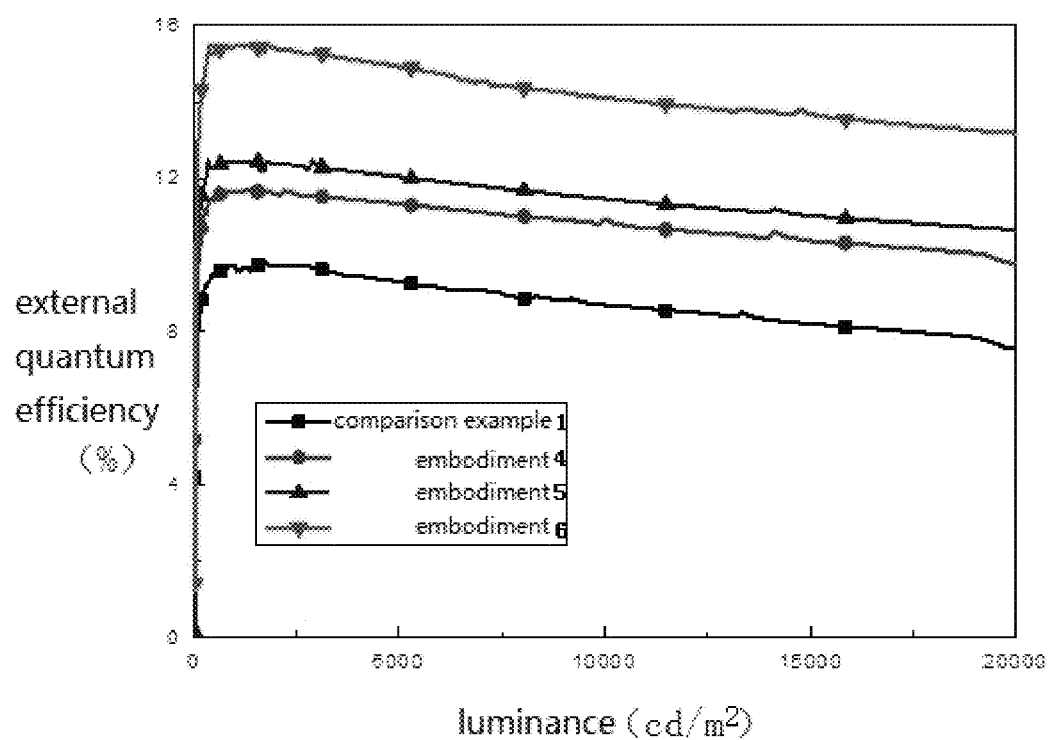
FIG. 3 is an illuminance-external quantum efficiency test result diagram of the organic electroluminescent device in Exemplary embodiments 4-6 of the present application and Comparison Example 1.

As known from Table 2 and FIG. 3, at the same luminance, the organic electroluminescent devices in Exemplary embodiment 4, Exemplary embodiment 5 and Exemplary embodiment 6 have higher external quantum efficiency than the organic electroluminescent device in Comparison Example 1, which indicates that doping the hole transport layer and/or the electron transport layer with the inert material can similarly reduce the loss of light in the device, increase the optical output efficiency of the organic electroluminescent device and increase the external quantum efficiency. In another aspect, the organic electroluminescent device in Exemplary embodiment 6 has higher external quantum efficiency than the organic electroluminescent devices in Exemplary embodiment 4 and Exemplary embodiment 5, which indicates that simultaneously doping both the hole transport layer and the electron transport layer with the inert material can lead to a better optical output effect than only doping the hole transport layer or the electron transport layer with the inert material, significantly increase the external quantum efficiency of the organic electroluminescent device and be in favor of realizing high-efficiency light-emitting of the device.

Exemplary Embodiment 7

An exemplary embodiment of the present application provides an organic electroluminescent device, which differs from Exemplary embodiment 4 in that the carrier transport layer comprises a hole transport layer which is formed by hole transport material doped with inert material therein. The inert material has a doping proportion of 10 wt %; the inert material has a molecular structure of formula (I-4) where n=5, with a refractive index of 1.3. The hole transport material has a molecular structure of formula (III-5). And the electron transport material has a molecular structure of formula (II-3). The evaporation-plating conditions in relation to the inert material (I-4) are a vacuum degree of $5 \times 10^{-4}$ Pa and an evaporation-plating temperature of 180° C. The hole transport layer has a thickness of 150 nm. The maximal external quantum efficiency of Exemplary embodiment 7 is 10.9%.

Exemplary Embodiment 8

An exemplary embodiment of the present application provides an organic electroluminescent device, which differs from Exemplary embodiment 5 in that the carrier transport layer comprises an electron transport layer which is formed by electron transport material doped with inert material therein. The inert material has a doping proportion of 90 wt %; the inert material has a molecular structure of formula (I-5) where n=40, with a refractive index of 1.35. The hole transport material has a molecular structure of formula (III-6), and the electron transport material has a molecular structure of formula (II-4). The evaporation-plating conditions in relation to the inert material (I-5) are a vacuum degree of $5 \times 10^{-4}$ Pa and an evaporation-plating temperature of 228° C. The electron transport layer has a thickness of 15 nm. The maximal external quantum efficiency of Exemplary embodiment 8 is 11.1%.

Exemplary Embodiment 9

An exemplary embodiment of the present application provides an organic electroluminescent device, which differs from Exemplary embodiment 6 in that the carrier transport layer comprises a hole transport layer and an electron transport layer. The electron transport layer is formed by electron transport material doped with inert material. The inert material has a doping proportion of 50 wt %. The inert material has a molecular structure of formula (I-6) where n=20, with a refractive index of 1.33. The hole transport material has a molecular structure of formula (III-7), and the electron transport material has a molecular structure of formula (II-5). The evaporation-plating conditions in relation to the inert material (I-6) are a vacuum degree of $5 \times 10^{-4}$ Pa and an evaporation-plating temperature of 200° C. The hole transport layer has a thickness of 15 nm, and the electron transport layer has a thickness of 100 nm. The maximal external quantum efficiency of Exemplary embodiment 9 is 11.9%.

Exemplary Embodiment 10

An exemplary embodiment of the present application provides an organic electroluminescent device, which differs from Exemplary embodiment 6 in that the carrier transport layer comprises a hole transport layer and an electron transport layer. The hole transport layer is formed by hole transport material doped with inert material. The inert material has a doping proportion of 40 wt %; the inert material has a molecular structure of formula (I-7) where n=40, with a refractive index of 1.3. The hole transport material has a molecular structure of formula (III-8), and the electron transport material has a molecular structure of formula (II-6). The evaporation-plating conditions in relation to the inert material (I-7) are a vacuum degree of $5 \times 10^{-4}$ Pa and an evaporation-plating temperature of 240° C. The hole transport layer has a thickness of 80 nm, and the electron transport layer has a thickness of 50 nm. The maximal external quantum efficiency of Exemplary embodiment 10 is 11.8%.

Exemplary Embodiment 11

An exemplary embodiment of the present application provides an organic electroluminescent device, which differs from Exemplary embodiment 6 in that the carrier transport layer comprises a hole transport layer and an electron transport layer, wherein the electron transport layer is formed by electron transport material doped with inert material, the electron transport material has a molecular structure of formula (II-7). The hole transport layer is formed by hole transport material doped with inert material. The hole transport material has a molecular structure of formula (III-2). The inert material doping into the electron transport layer and the hole transport layer respectively has doping proportions of 25 wt % and 35 wt %. And the inert material has a molecular structure of formula (I-7) where n=25, with a refractive index of 1.35. The evaporation-plating conditions of the carrier transport layers are a vacuum degree of $5 \times 10^{-4}$ Pa and an evaporation-plating temperature of 220° C. The hole transport layer has a thickness of 200 nm, and the electron transport layer has a thickness of 300 nm. The maximal external quantum efficiency of Exemplary embodiment 11 is 10.9%.

Exemplary Embodiment 12

An exemplary embodiment of the present application provides an organic electroluminescent device, which differs from Exemplary embodiment 6 in that the carrier transport layer comprises a hole transport layer and an electron transport layer, wherein the electron transport layer is formed by electron transport material doped with inert material. The electron transport material has a molecular structure of formula (II-8). The inert material doping into the electron transport layer has a molecular structure of formula (I-8) where n=15, with a refractive index of 1.3 and a doping proportion of 55 wt %. The hole transport layer is formed by hole transport material doped with inert material. The hole transport material has a molecular structure of formula (III-3). The inert material doping into the hole transport layer has a molecular structure of formula (I-1) where n=26, with a refractive index of 1.35 and a doping proportion of 55 wt %. The evaporation-plating conditions in relation to the inert material (I-8) are a vacuum degree of $5 \times 10^{-4}$ Pa and an evaporation-plating temperature of 230° C. The hole transport layer has a thickness of 40 nm, and the electron transport layer has a thickness of 90 nm. The maximal external quantum efficiency of Exemplary embodiment 12 is 11.2%.

In the above exemplary embodiments, alternatively, the hole transport material is material having hole transport capability selected from at least one of a triazole derivative, an oxadiazole derivative, an imidazole derivative, a carbazole derivative, an indole carbazole derivatives, a polyaromatic alkane derivative, a pyrazoline derivative, a pyrazolone derivative, a phenylenediamine derivative, an aromatic amine derivative, an amino-substituted chalcone derivative, an oxazole derivative, a styryl-anthracene derivative, a fluorenone derivative, a hydrazone derivative, a stilbene derivative, a silazane derivative, an aniline copolymer, a thiophene oligomer, a porphyrin compound, an aromatic tertiary amine compound, and a styryl amine compound.

Alternatively, the hole transport material may also choose material with a structure of any one of formulas (III-1) to (III-8), or any other material having hole transport capability.

Alternatively, the electron transport material is material having electron transport capability selected from at least one of a quinoline derivative, a phenolic pyridine derivative, an o-phenanthroline derivative, a diphenyl benzoquinone derivative, a thiophene derivative, a furan derivatives, a carbodiimide derivative, a pyridine derivative, a diphenyl phosphoryl derivative, a dibenzothiophene derivative, an oxadiazole derivative, an anthraquinone di-methane derivative, an anthraquinone derivative, a triazine derivative, and a pyrazine derivative.

Alternatively, the electron transport material may also choose material with a structure of any one of formulas (II-1) to (II-11), or any other material having electron transport capability.

Alternatively, the inert material may also choose a compound with a structure of any one of the following formulas (I-1) to (I-18), or any other chemical inert material having a refractive index less than 1.5; wherein, the n is an integer smaller than 50. Preferably, the n is an integer between 10 and 30, which likewise can achieve the purpose of the present application and belongs to the protection scope of the present application.

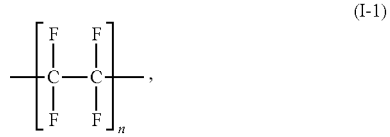

(I-1)

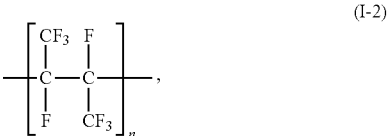

(I-2)

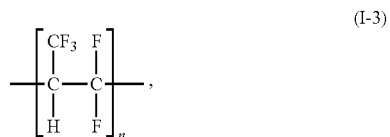

(I-3)

-continued (I-4) 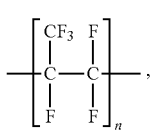

(I-5) 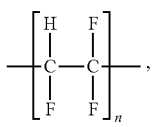

(I-6) 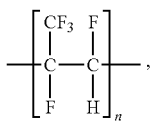

(I-7) 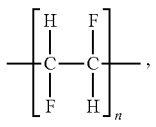

(I-8) 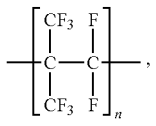

(I-9) 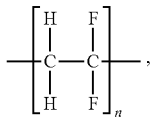

(I-10) 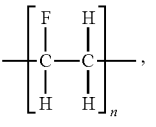

(I-11) 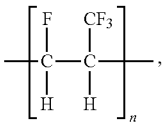

(I-12) 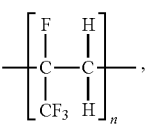

(I-13) 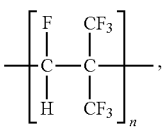

(I-14) 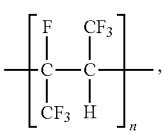

(I-15) 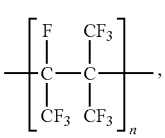

-continued (I-16) 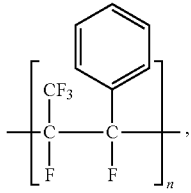

(I-17) 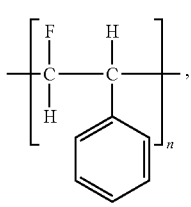

(I-18) 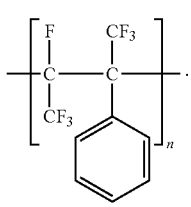

Alternatively, the thickness of the electron transport layer or the hole transport layer may also choose any thickness in a range of 5 nm-500 nm, preferably 15 nm-100 nm, which likewise can achieve the purpose of the present application and belongs to the protection scope of the present application.

Alternatively, the organic electroluminescent device provided by the present application comprises a cathode, an anode, and a light-emitting layer located between the cathode and the anode, and also comprises carrier transport layer(s). The carrier transport layer(s) is/are arranged between the light-emitting layer and the anode and/or between the light-emitting layer and the cathode.

Apparently, the aforementioned exemplary embodiments are merely examples illustrated for clearly describing the present application, rather than limiting the implementation ways thereof. For a person skilled in the art, various changes and modifications in other different forms can be made on the basis of the aforementioned description. It is unnecessary and impossible to exhaustively list all the implementation ways herein. However, any obvious changes or modifications derived from the aforementioned description are intended to be embraced within the protection scope of the present application.

The invention claimed is:

1. An organic electroluminescent device, comprising carrier transport layers, the carrier transport layers comprising an electron transport layer and/or a hole transport layer, at least one of the carrier transport layers being doped with inert material having a refractive index less than 1.5, wherein the inert material has the following molecular structure:

(I) 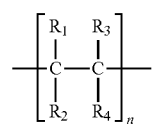

wherein $R_1$, $R_2$, $R_3$, $R_4$ are individually selected from any one of fluorine, trifluoromethyl group, hydrogen and phenyl group, and at least one from $R_1$, $R_2$, $R_3$, $R_4$ is fluorine; and n is an integer, wherein, the inert material has a doping proportion of 10 wt % to 90 wt %.

2. The organic electroluminescent device of claim 1, wherein, the n is an integer between 5 and 50.

3. The organic electroluminescent device of claim 1, wherein, the inert material has a molecular structure selected from any one of the following structural formulas:

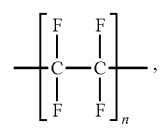
(I-1)

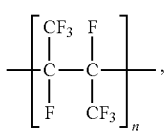
(I-2)

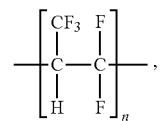
(I-3)

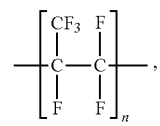
(I-4)

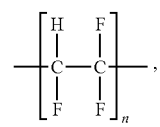
(I-5)

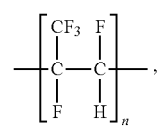
(I-6)

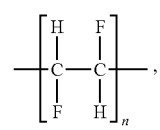
(I-7)

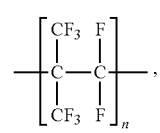
(I-8)

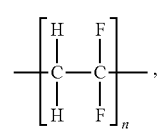
(I-9)

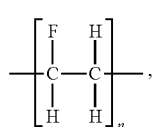
(I-10)

-continued

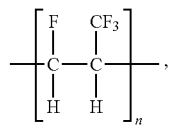
(I-11)

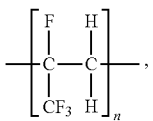
(I-12)

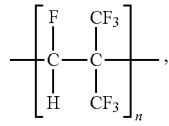
(I-13)

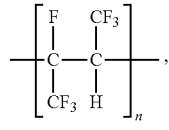
(I-14)

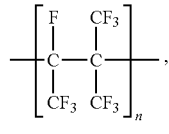
(I-15)

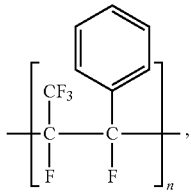
(I-16)

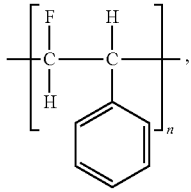
(I-17)

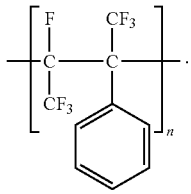
(I-18)

4. The organic electroluminescent device of claim 3, wherein, the n is an integer between 10 and 30.

5. The organic electroluminescent device of claim 1, wherein, the inert material has a doping proportion of 30 wt % to 60 wt %.

6. The organic electroluminescent device of claim 1, wherein, the electron transport layer has an electron transport material, the electron transport material comprising at least one selected from a quinoline derivative, a phenolic pyridine derivative, an o-phenanthroline derivative, a diphenyl benzoquinone derivative, a thiophene derivative, a furan derivatives, a carbodiimide derivative, a pyridine derivative, a diphenyl phosphoryl derivative, a dibenzothiophene derivative, an oxadiazole derivative, an anthraquinone dimethane derivative, an anthraquinone derivative, a triazine derivative, and a pyrazine derivative.
7. The organic electroluminescent device of claim 6, wherein, the electron transport material has a molecular structure selected from any one of the following structural formulas:
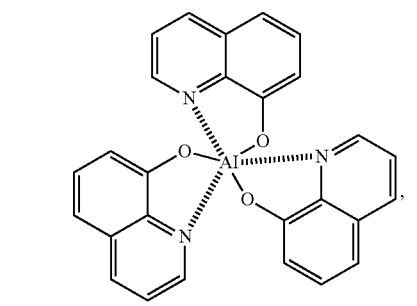
(II-1)
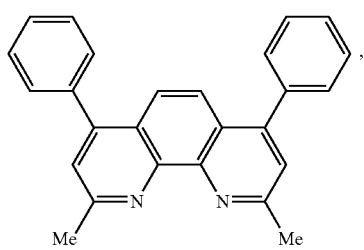
(II-2)
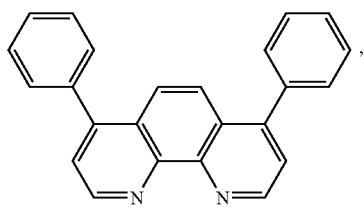
(II-3)
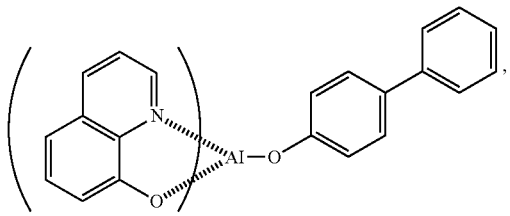
(II-4)
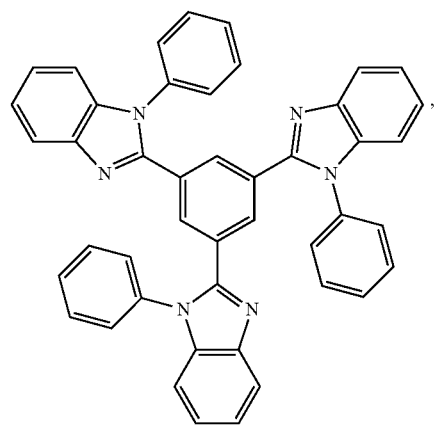
(II-5)
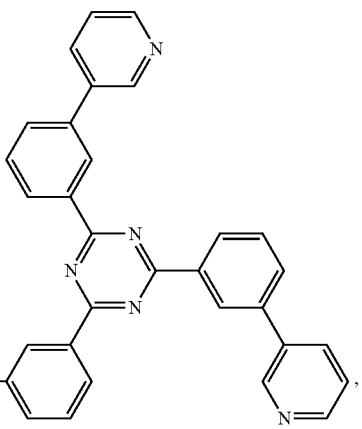
(II-6)
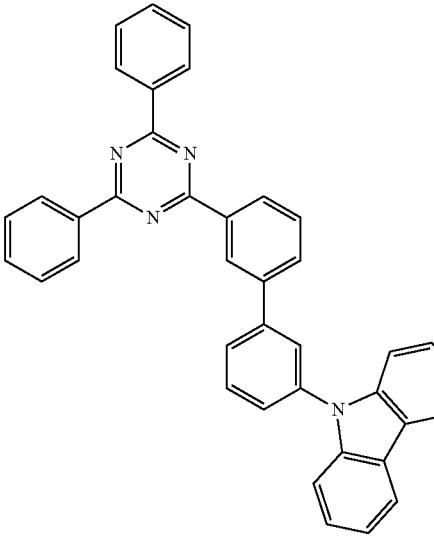
(II-7)
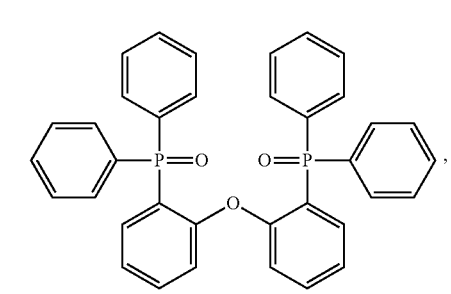
(II-8)
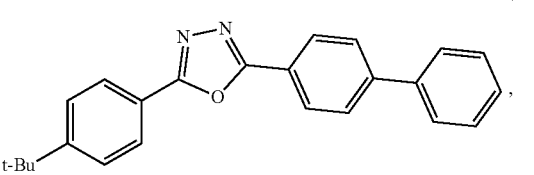
(II-9)

-continued

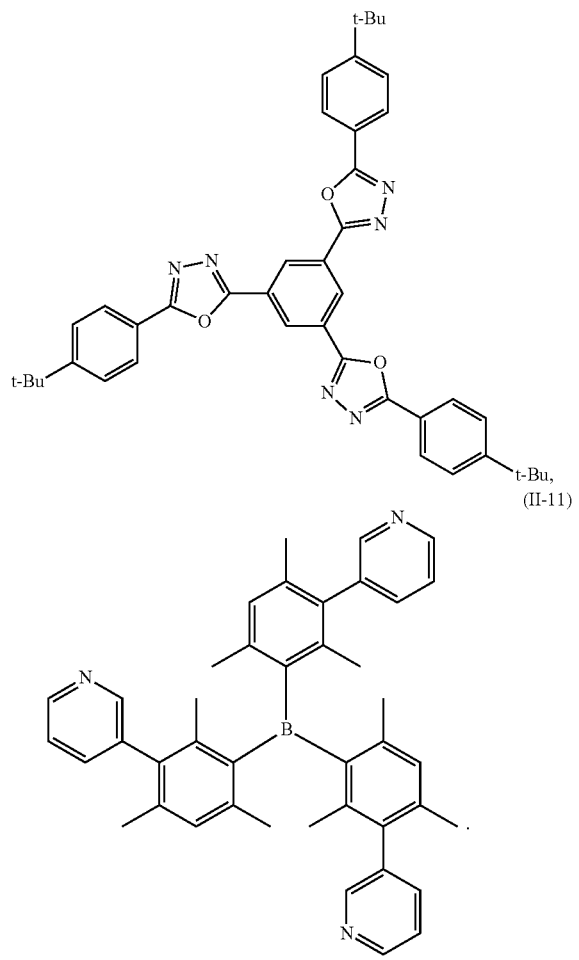

(II-10)

(II-11)

-continued

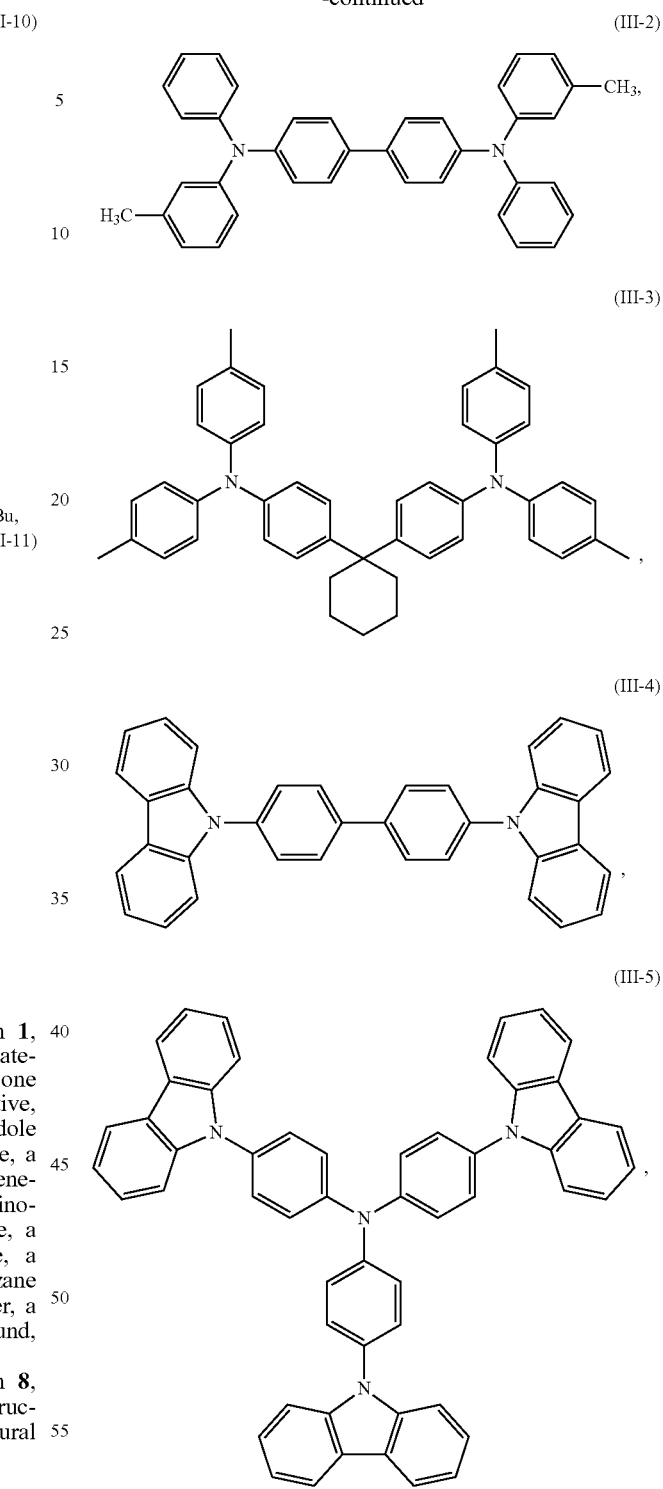

(III-2)

(III-3)

(III-4)

(III-5)

8. The organic electroluminescent device of claim 1, wherein, the hole transport layer has a hole transport material, the hole transport material comprising at least one selected from a triazole derivative, an oxadiazole derivative, an imidazole derivative, a carbazole derivative, an indole carbazole derivatives, a polyaromatic alkane derivative, a pyrazoline derivative, a pyrazolone derivative, a phenylenediamine derivative, an aromatic amine derivative, an amino-substituted chalcone derivative, an oxazole derivative, a styryl-anthracene derivative, a fluorenone derivative, a hydrazone derivative, a stilbene derivative, a silazane derivative, an aniline copolymer, a thiophene oligomer, a porphyrin compound, an aromatic tertiary amine compound, and a styryl amine compound.

9. The organic electroluminescent device of claim 8, wherein, the hole transport material has a molecular structure selected from any one of the following structural formulas:

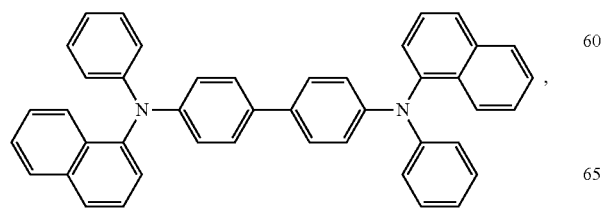

(III-1)

(III-6)

-continued (III-7)

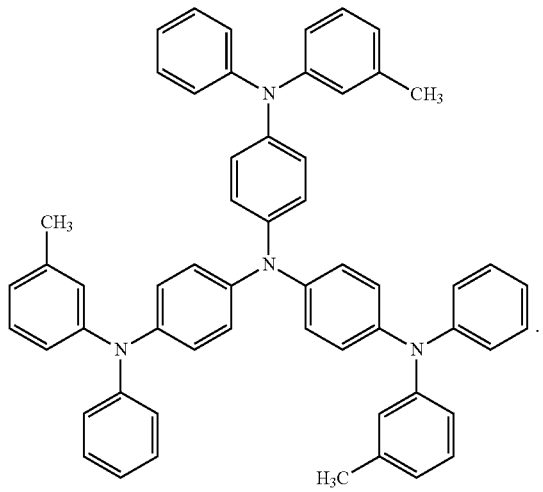

10. The organic electroluminescent device of claim 1, wherein, the electron transport layer or the hole transport layer has a thickness of 5 nm to 500 nm.

11. The organic electroluminescent device of claim 10, wherein, the electron transport layer or the hole transport layer has a thickness of 15 nm to 100 nm.

12. An organic electroluminescent device, comprising carrier transport layers, the carrier transport layers comprising an electron transport layer and/or a hole transport layer, at least one of the carrier transport layers being doped with inert material having a refractive index less than 1.5, wherein, the inert material has the following molecular structure:

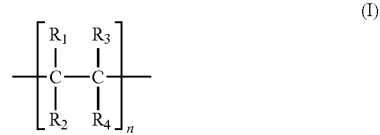

(I)

wherein $R_1$, $R_2$, $R_3$, $R_4$ are individually selected from any one of hydrogen and phenyl group; and n is an integer.

13. The organic electroluminescent device of claim 12, wherein, the n is an integer between 5 and 50.

14. The organic electroluminescent device of claim 13, wherein, the n is an integer between 10 and 30.

15. The organic electroluminescent device of claim 12, wherein the inert material has a doping proportion of 10 wt % to 90 wt %.

16. The organic electroluminescent device of claim 15, wherein the inert material has a doping proportion of 30 wt % to 60 wt %.

* * * * *